(12) United States Patent
Roh et al.

(10) Patent No.: US 11,417,816 B2
(45) Date of Patent: Aug. 16, 2022

(54) THERMOELECTRIC ELEMENT AND MANUFACTURING METHOD THEREOF

(71) Applicant: LG INNOTEK CO., LTD., Seoul (KR)

(72) Inventors: Myoung Lae Roh, Seoul (KR); Jong Min Lee, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/962,606

(22) PCT Filed: Jan. 22, 2019

(86) PCT No.: PCT/KR2019/000893
§ 371 (c)(1),
(2) Date: Jul. 16, 2020

(87) PCT Pub. No.: WO2019/146990
PCT Pub. Date: Aug. 1, 2019

(65) Prior Publication Data
US 2021/0091293 A1 Mar. 25, 2021

(30) Foreign Application Priority Data
Jan. 23, 2018 (KR) .......................... 10-2018-0008423

(51) Int. Cl.
*H01L 35/32* (2006.01)
*H01L 35/02* (2006.01)
(52) U.S. Cl.
CPC .............. *H01L 35/32* (2013.01); *H01L 35/02* (2013.01)
(58) Field of Classification Search
CPC ................................ H01L 35/02; H01L 35/32
See application file for complete search history.

(56) References Cited

U.S. PATENT DOCUMENTS

| 6,105,373 | A | * | 8/2000 | Watanabe | ............... | H01L 35/30 62/3.7 |
| 2009/0025770 | A1 | * | 1/2009 | Lofy | ....................... | H01L 35/34 136/201 |

(Continued)

FOREIGN PATENT DOCUMENTS

| EP | 2 894 682 | 7/2015 |
| JP | 11-274579 | 10/1999 |

(Continued)

OTHER PUBLICATIONS

Korean Office Action dated Jan. 11, 2021 issued in Application No. 10-2019-0058001.

(Continued)

*Primary Examiner* — Tamir Ayad
(74) *Attorney, Agent, or Firm* — Ked & Associates, LLP

(57) ABSTRACT

A thermoelectric element according to an embodiment of the present invention comprises: a first metallic substrate; a first resin layer which is disposed on the first metallic substrate and comes in direct contact with the first metallic substrate; a plurality of first electrodes disposed on the first resin layer; a plurality of P-type thermoelectric legs and a plurality of N-type thermoelectric legs disposed on the plurality of first electrodes; a plurality of second electrodes disposed on the plurality of P-type thermoelectric legs and the plurality of N-type thermoelectric legs; a second resin layer disposed on the plurality of second electrodes; and a second metallic substrate disposed on the second resin layer, wherein a surface of the first metallic substrate that faces the first resin layer comprises a first region and a second region disposed inside the first region, wherein a surface roughness of the second region is greater than a surface roughness of the first region, wherein the first resin layer is disposed on the second region.

14 Claims, 9 Drawing Sheets

(56) References Cited

U.S. PATENT DOCUMENTS

| | | | |
|---|---|---|---|
| 2012/0018835 A1* | 1/2012 | Sawabe | H01L 35/06 |
| | | | 257/470 |
| 2013/0065987 A1 | 3/2013 | Fukuzaki et al. | |
| 2013/0081663 A1 | 4/2013 | Yang et al. | |
| 2014/0000249 A1 | 1/2014 | Moors et al. | |
| 2014/0000670 A1* | 1/2014 | Oesterle | H01L 35/04 |
| | | | 136/212 |
| 2015/0194589 A1 | 7/2015 | Roh | |
| 2016/0322555 A1* | 11/2016 | Park | H01L 35/14 |

FOREIGN PATENT DOCUMENTS

| | | |
|---|---|---|
| JP | 2001-068745 | 3/2001 |
| JP | 2011-187511 | 9/2011 |
| JP | 2013-062379 | 4/2013 |
| KR | 10-2013-0035016 | 4/2013 |
| KR | 10-2014-0020908 | 2/2014 |
| KR | 10-2017-0127994 | 11/2017 |

OTHER PUBLICATIONS

European Search Report dated Oct. 18, 2021 issued in EP Application No. 19743973.0.

* cited by examiner

[FIG.1]
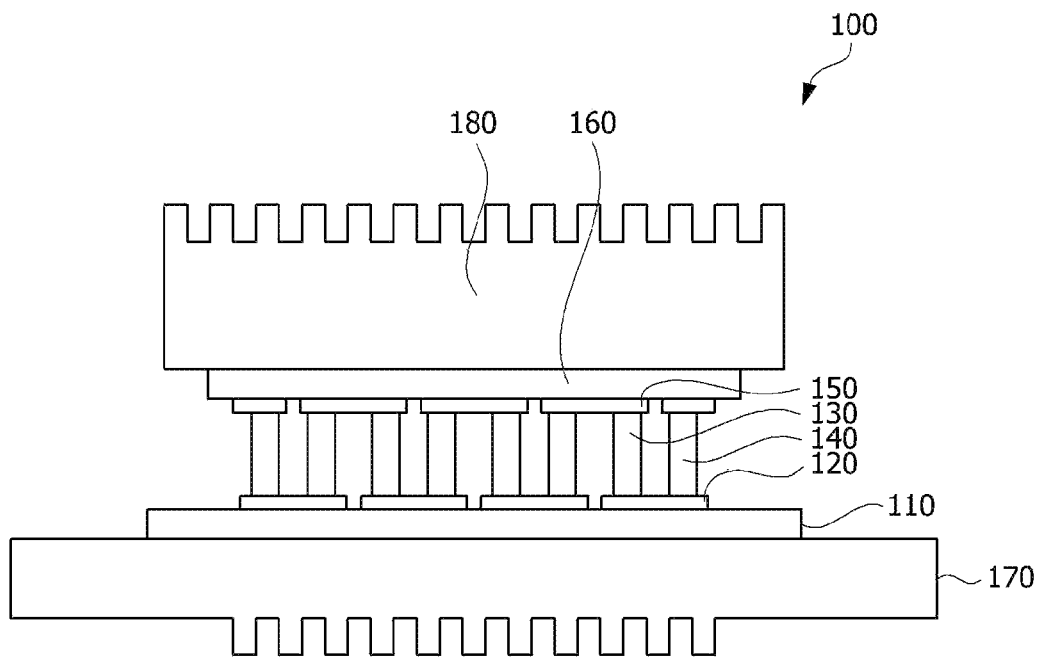
[FIG.2]
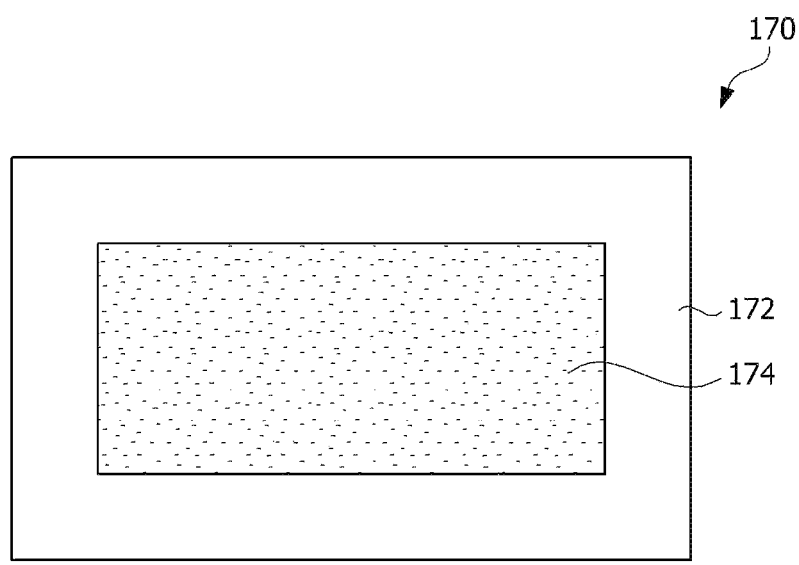

[FIG.3]
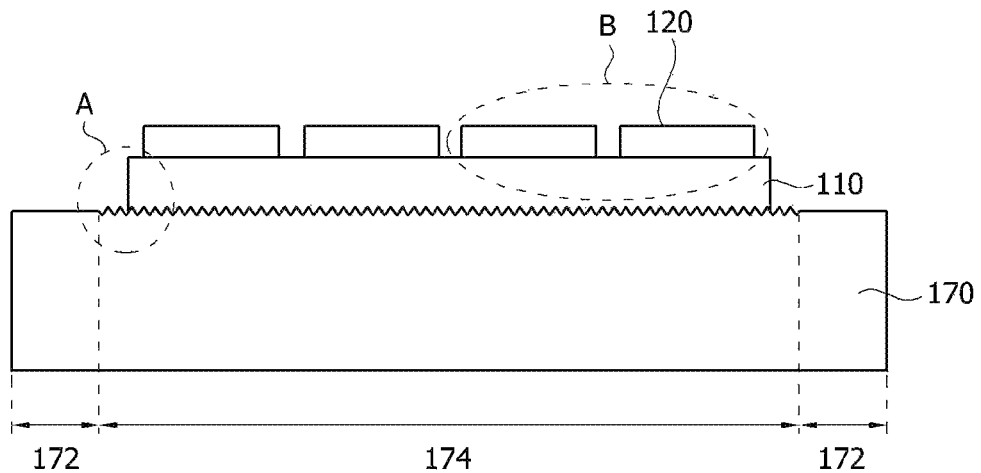
[FIG.4]
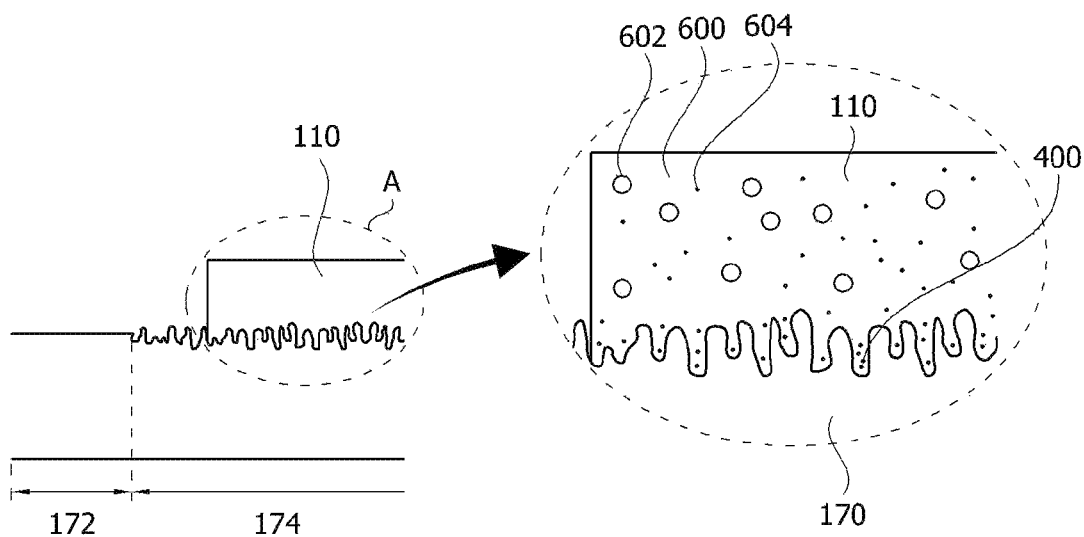
[FIG.5]
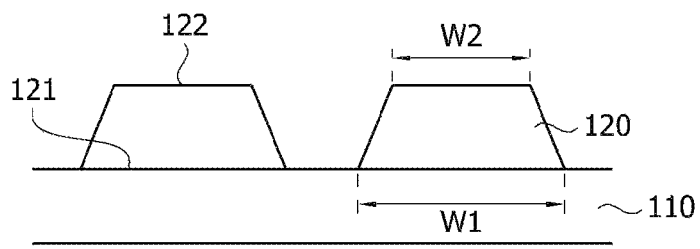

[FIG.6]
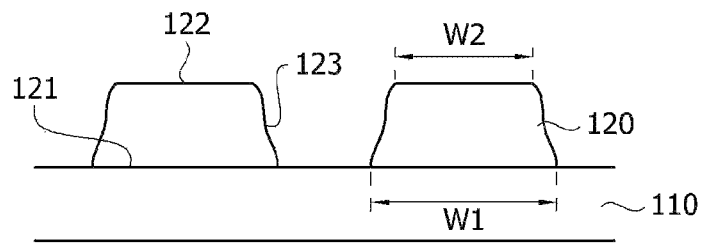
[FIG.7]
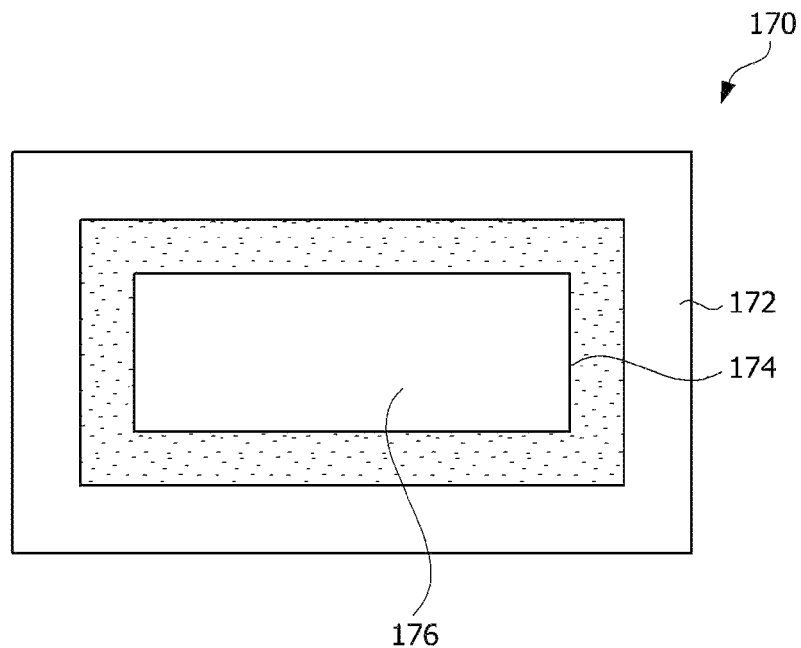

[FIG.8]
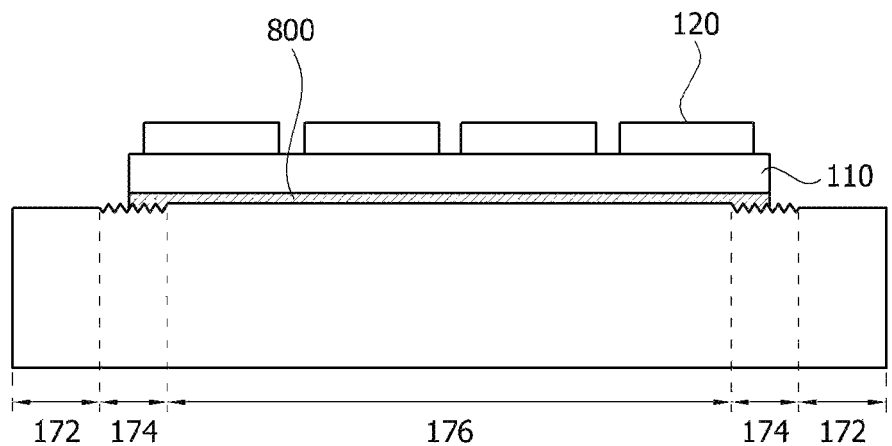
[FIG.9]
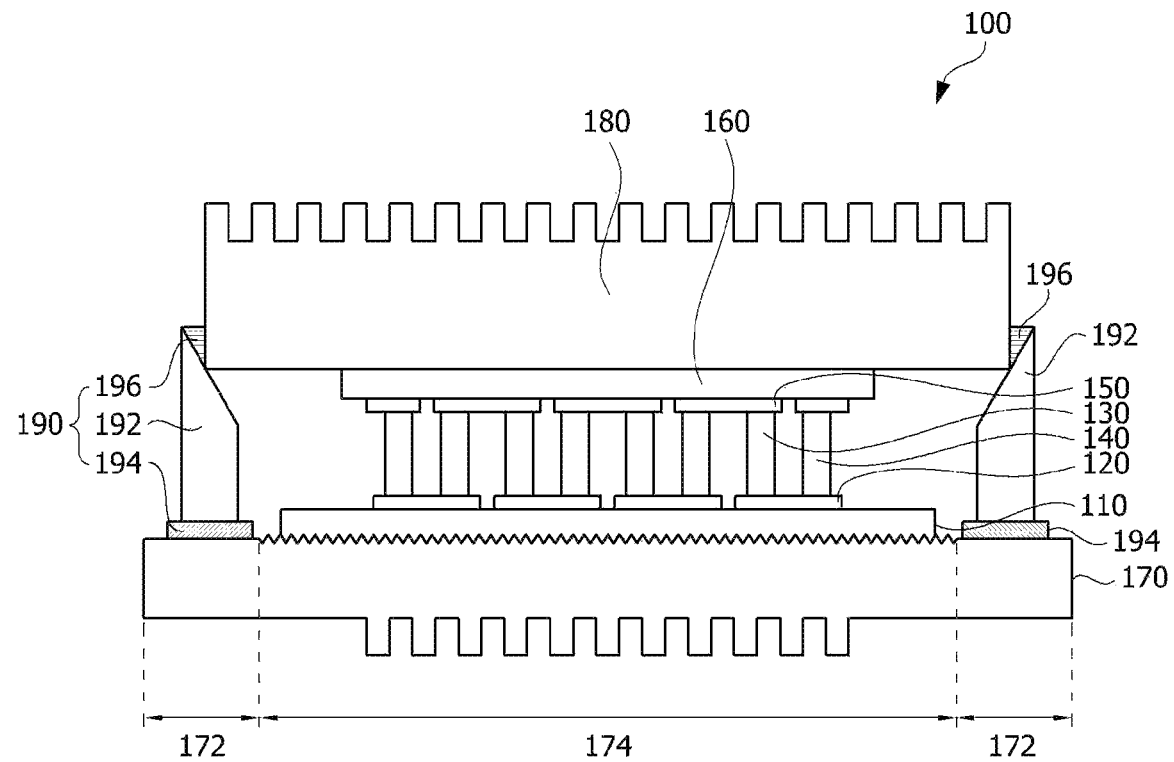

[FIG.10]
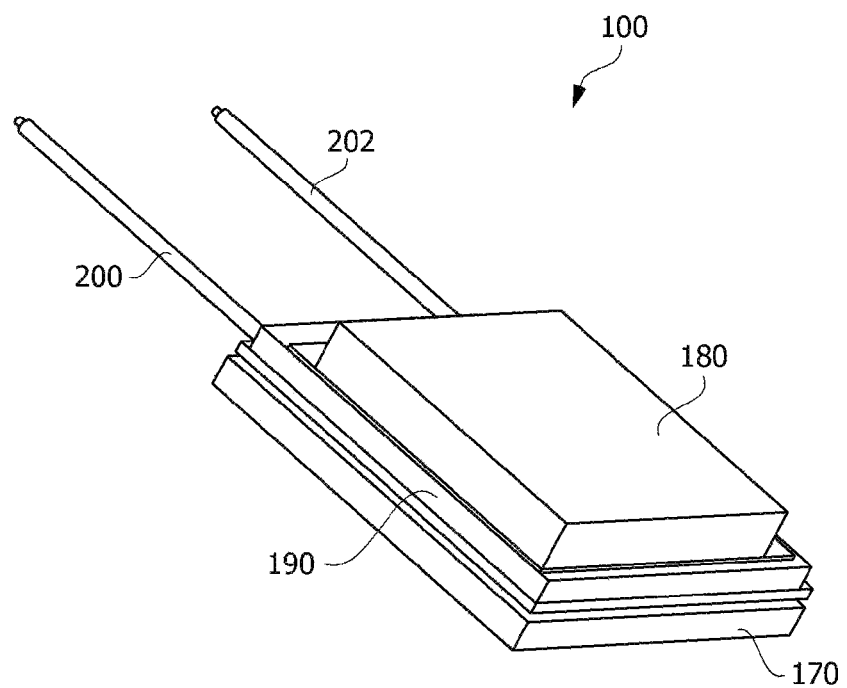

[FIG.11]
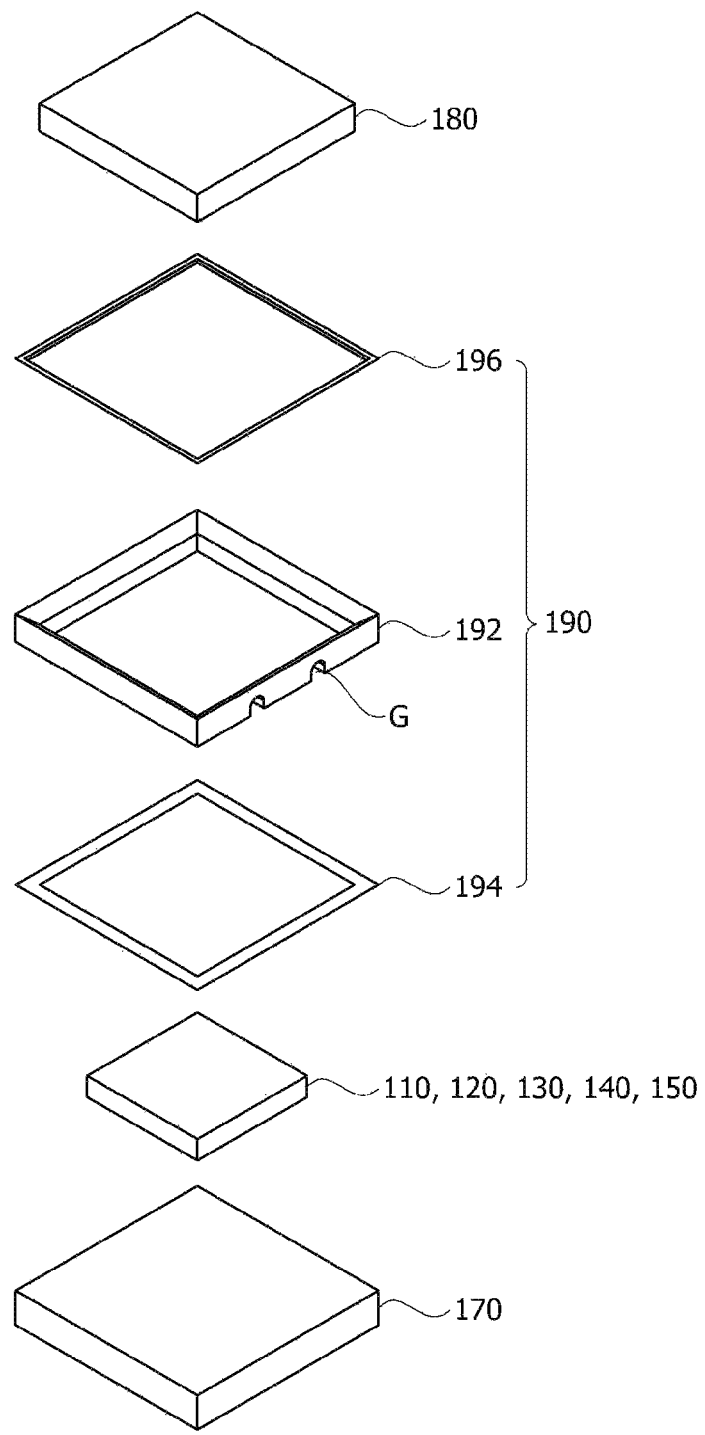

[FIG.12]
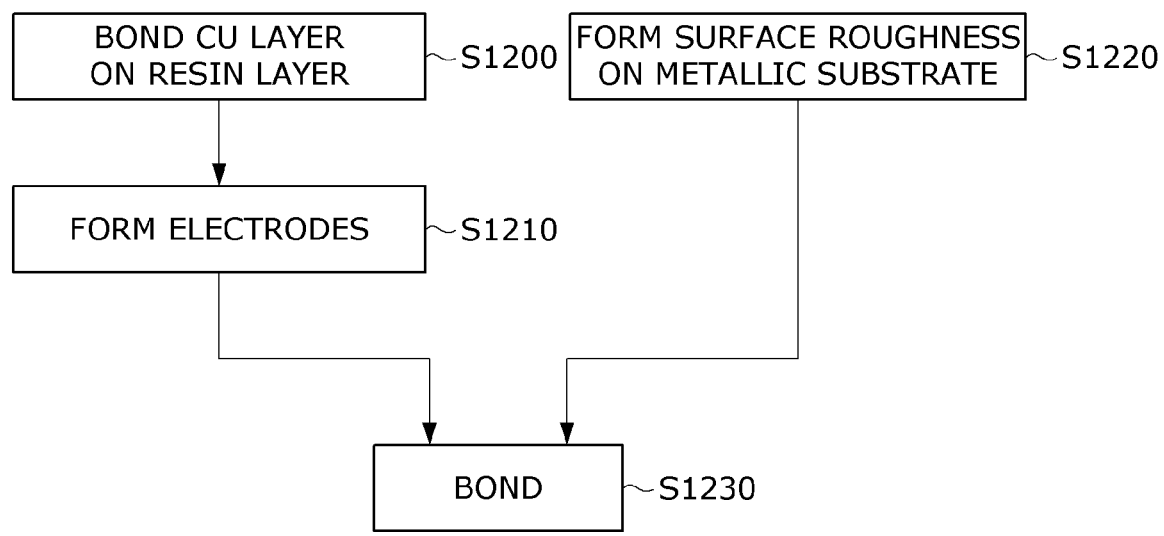

[FIG.13A]
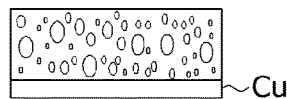
[FIG.13B]
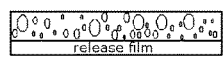
[FIG.13C]
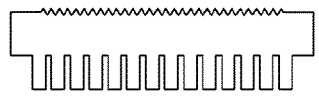
[FIG.13G]
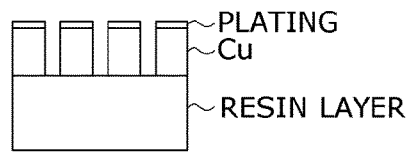
[FIG.13D]
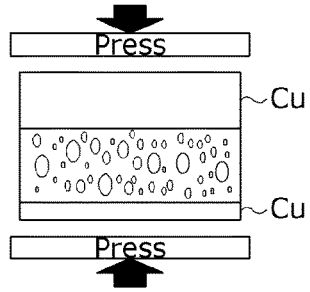
[FIG.13H]
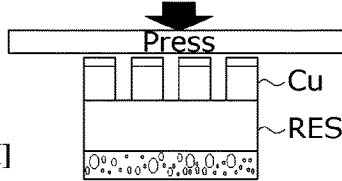
[FIG.13E]
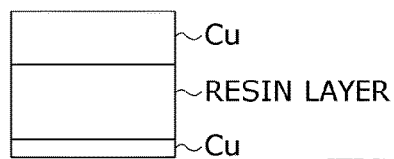
[FIG.13I]
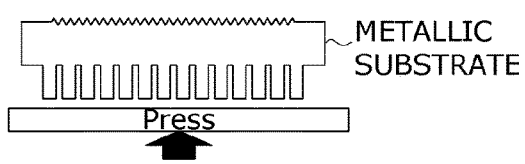
[FIG.13F]
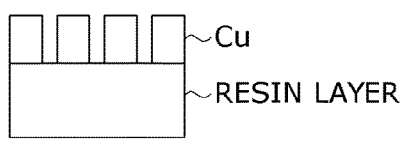
[FIG.13J]
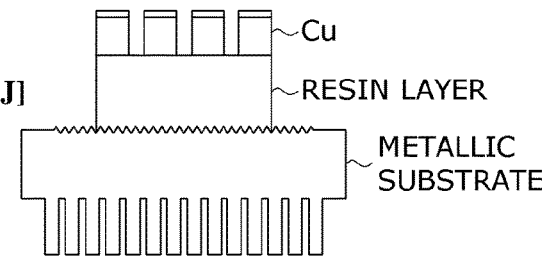

[FIG.14]
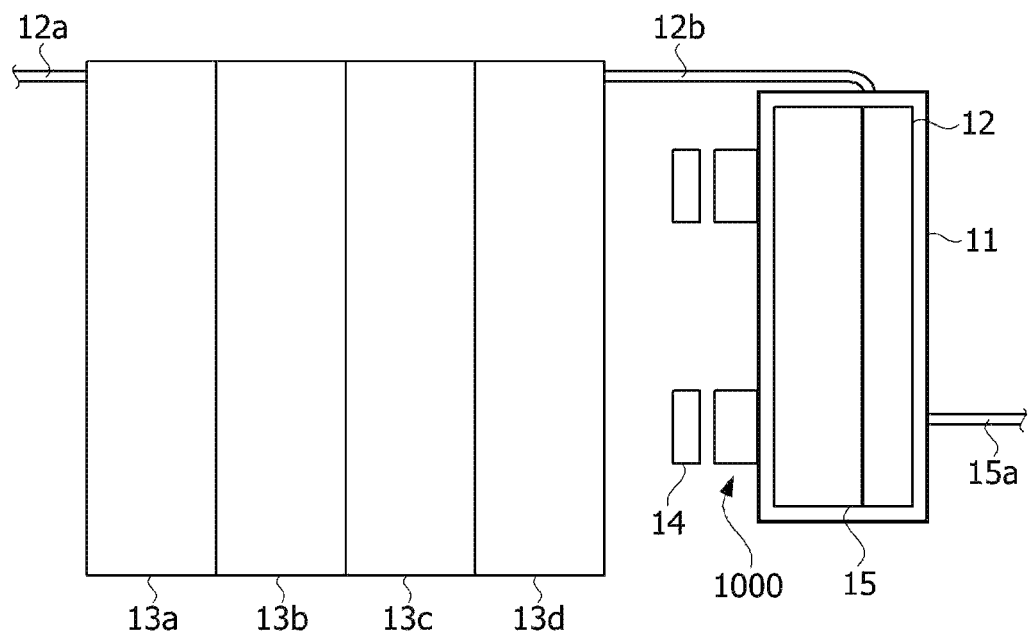
[FIG.15]
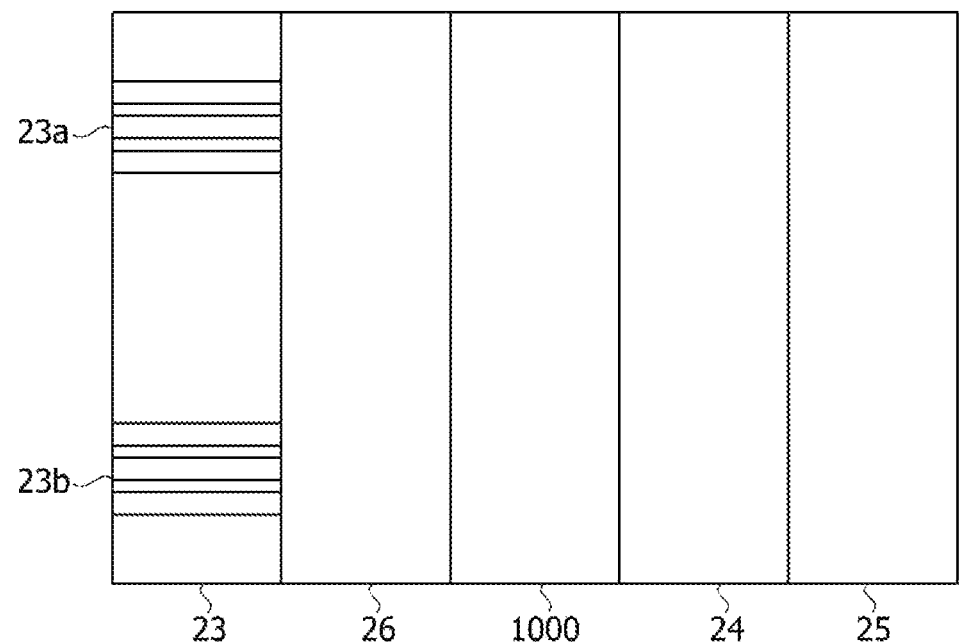

THERMOELECTRIC ELEMENT AND MANUFACTURING METHOD THEREOF

CROSS-REFERENCE TO RELATED PATENT APPLICATIONS

This application is a U.S. National Stage Application under 35 U.S.C. § 371 of PCT Application No. PCT/KR2019/000893, filed Jan. 22, 2019, which claims priority to Korean Patent Application No. 10-2018-0008423, filed Jan. 23, 2018, whose entire disclosures are hereby incorporated by reference.

TECHNICAL FIELD

The present invention relates to a thermoelectric element and, more particularly, to a bonding structure of a thermoelectric element.

BACKGROUND ART

A thermoelectric phenomenon is a phenomenon occurring due to movement of electrons and holes in a material and means direct energy conversion between heat and electricity.

A thermoelectric element is a generic term for elements in which the thermoelectric phenomenon is used and has a structure in which P-type thermoelectric materials and N-type thermoelectric materials are joined between metal electrodes to form PN junction pairs.

The thermoelectric elements may be divided into elements which use a change in electrical resistance according to a change in temperature, elements which use the Seebeck effect in which an electromotive force is generated due to a difference in temperature, and elements which use the Peltier effect in which heat absorption or heating occurs due to a current.

The thermoelectric elements are being variously applied to home appliances, electronic components, communication components, and the like. For example, the thermoelectric elements may be applied to cooling devices, heating devices, power generation devices, and the like. Accordingly, the demand for thermoelectric performance of the thermoelectric elements is gradually increasing.

The thermoelectric element includes substrates, electrodes, and thermoelectric legs, wherein a plurality of thermoelectric legs are disposed in the form of an array between an upper substrate and a lower substrate, a plurality of upper electrodes are disposed between the upper substrate and the plurality of thermoelectric legs, and a plurality of lower electrodes are disposed between the plurality of thermoelectric legs and the lower substrate.

In general, thermoelectric elements may be disposed on a metallic support. When an upper substrate and a lower substrate included in the thermoelectric element are ceramic substrates, heat loss may occur due to thermal resistance at the interface between the thermoelectric element and the metallic support.

DISCLOSURE

Technical Problem

The present invention is directed to providing a bonding structure of a thermoelectric element.

Technical Solution

One aspect of the present invention provides a thermoelectric element including a first metallic substrate, a first resin layer which is disposed on the first metallic substrate and is in direct contact with the first metallic substrate, a plurality of first electrodes disposed on the first resin layer, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, a second resin layer disposed on the plurality of second electrodes, and a second metallic substrate disposed on the second resin layer, wherein a surface of the first metallic substrate, which faces the first resin layer, includes a first region and a second region disposed in the first region, a surface roughness of the second region is greater than a surface roughness of the first region, and the first resin layer is disposed on the second region.

The first resin layer may include an epoxy resin and an inorganic filler, the inorganic filler may include a first inorganic filler and a second inorganic filler, and a particle size (D50) of the first inorganic filler may be greater than a particle size (D50) of the second inorganic filler.

The surface roughness of the second region may be greater than the particle size (D50) of the first inorganic filler and less than the particle size (D50) of the second inorganic filler.

The surface roughness of the second region may be 1.05 to 1.5 times the particle size (D50) of the first inorganic filler.

The surface roughness of the second region may be 0.04 to 0.15 times the particle size (D50) of the second inorganic filler.

The surface roughness of the second region may be in a range of 10 μm to 50 μm, the particle size (D50) of the first inorganic filler may be in a range of 10 μm to 30 μm, and the particle size (D50) of the second inorganic filler may be in a range of 250 μm to 350 μm.

The first resin layer may include an epoxy resin and an inorganic filler, and the content of the epoxy resin and the inorganic filler in grooves formed due to the surface roughness of the second region may be different from the content of the epoxy resin and the inorganic filler in an intermediate region between the first metallic substrate and the plurality of first electrodes.

A portion of the epoxy resin and a portion of the first inorganic filler may be disposed in at least some of the grooves formed due to the surface roughness of the second region.

The surface of the first metallic substrate facing the first resin layer may further include a third region disposed in the second region, the first resin layer may be disposed on the third region and a portion of the second region, and the surface roughness of the second region may be greater than the surface roughness of the third region.

The thermoelectric element may further include an adhesive layer disposed between the first metallic substrate and the first resin layer, and a portion of the adhesive layer may be disposed in at least some of the grooves formed due to the surface roughness of the second region.

Another aspect of the present invention provides a thermoelectric element including a first metallic substrate, a first resin layer disposed on the first metallic substrate, a plurality of first electrodes disposed on the first resin layer, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, a second resin layer disposed on the plurality of second electrodes, a second metallic substrate disposed on the second resin layer, and a sealing part disposed between the first metallic substrate and the second metallic substrate, wherein a surface of the first metallic substrate facing the first resin layer includes a first region and a second region disposed in the first region, the sealing part is disposed on the first region, and the first resin layer is disposed on the second region.

The sealing part may include a sealing case disposed at a predetermined distance from a side surface of the first resin layer and a side surface of the second resin layer and a sealing material disposed between the sealing case and the first region.

A width length of the first metallic substrate may be greater than a width length of the second metallic substrate.

The first metallic substrate may emit heat and the second metallic substrate may absorb heat.

A thickness of the first metallic substrate may be less than a thickness of the second metallic substrate.

The first resin layer may be disposed to be spaced apart from the boundary between the first region and the second region by a predetermined distance.

The first resin layer may be formed to be in direct contact with the first metallic substrate.

Still another aspect of the present invention provides a thermoelectric element including a first metallic substrate, a first resin layer disposed on the first metallic substrate, a plurality of first electrodes disposed on the first resin layer, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, a second resin layer disposed on the plurality of second electrodes, and a second metallic substrate disposed on the second resin layer, wherein the first resin layer includes an epoxy resin composition containing an epoxy resin and an inorganic filler, the inorganic filler includes at least one of aluminum oxide and nitride, and the inorganic filler is included in an amount of 68 to 88 vol % of the epoxy resin composition.

The nitride may be included in an amount of 55 to 95 wt % of the inorganic filler.

The nitride may include at least one of boron nitride and aluminum nitride.

The boron nitride may be a boron nitride agglomerate in which plate-shaped boron nitrides are agglomerated.

The inorganic filler may include an aluminum oxide having a particle size (D50) of 10 μm to 30 μm and a boron nitride agglomerate having a particle size (D50) of 250 μm to 350 μm.

The first resin layer may be formed to be in direct contact with the first metallic substrate.

Yet another aspect of the present invention provides a method of manufacturing a thermoelectric element, the method including bonding a resin layer and a metallic layer, forming a plurality of electrodes by etching the metallic layer, forming a surface roughness on a second region of one surface of a metallic substrate including a first region and the second region disposed in the first region, arranging the second region of the metallic substrate and the resin layer to be in contact with each other, and thermally pressing the metallic substrate and the resin layer.

The method may further include disposing an adhesive layer in a non-cured state between the metallic substrate and the resin layer before arranging the second region of the metallic substrate and the resin layer to be in contact with each other.

The disposing of the adhesive layer may further include coating the adhesive layer in a non-cured state on a release film, disposing the resin layer on the adhesive layer, pressing the resin layer and the adhesive layer, removing the release film, and disposing the surface from which the release film is removed on the second region of the metallic substrate.

The resin layer may include an epoxy resin composition, and the adhesive layer may include an epoxy resin composition that is the same as the epoxy resin composition included in the resin layer.

Still yet another aspect of the present invention provides a thermoelectric element including a first resin layer, a plurality of first electrodes disposed on the first resin layer, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, and a second resin layer disposed on the plurality of second electrodes, wherein at least one of the plurality of first electrodes includes a first surface facing the first resin layer and a second surface facing a pair of the P-type thermoelectric leg and the N-type thermoelectric leg, and a width length of the first surface is different from a width length of the second surface.

The width length of the second surface may be 0.8 to 0.95 times the width length of the first surface.

A side surface between the first surface and the second surface may include a curved surface having a predetermined curvature.

The thermoelectric element may further include a first metallic substrate on which the first resin layer is disposed and a second metallic substrate disposed on the second resin layer, wherein the first resin layer may be in direct contact with the first metallic substrate.

Advantageous Effects

According to embodiments of the present invention, a thermoelectric element having excellent thermal conductivity, low heat loss, and high reliability can be obtained. In particular, the thermoelectric element according to the embodiments of the present invention can have a high bonding strength with a metallic support and can be manufactured in a simple process.

DESCRIPTION OF DRAWINGS

FIG. 1 is a cross-sectional view of a thermoelectric element according to one embodiment of the present invention.

FIG. 2 is a top view of a metallic substrate included in the thermoelectric element according to one embodiment of the present invention.

FIG. 3 is a cross-sectional view of the metallic substrate of the thermoelectric element according to one embodiment of the present invention.

FIG. 4 is an enlarged view of one region of FIG. 3.

FIGS. 5 and 6 are enlarged views of another region of FIG. 3.

FIG. 7 is a top view of a metallic substrate included in a thermoelectric element according to another embodiment of the present invention.

FIG. 8 is a cross-sectional view of the metallic substrate of the thermoelectric element including the metallic substrate illustrated in FIG. 7.

FIG. 9 is a cross-sectional view of a thermoelectric element according to still another embodiment of the present invention.

FIG. 10 is a perspective view of the thermoelectric element according to FIG. 9.

FIG. 11 is an exploded perspective view of the thermoelectric element according to FIG. 9.

FIGS. 12 and 13A to 13J illustrate a method of manufacturing the thermoelectric element according to one embodiment of the present invention.

FIG. 14 is a view illustrating an example in which the thermoelectric element according to the embodiment of the present invention is applied to a water purifier.

FIG. 15 is a view illustrating an example in which the thermoelectric element according to the embodiment of the present invention is applied to a refrigerator.

MODES OF THE INVENTION

The present invention may be modified in various forms and have various embodiments, and thus particular embodiments thereof will be illustrated in the accompanying drawings and described in the detailed description. However, this is not intended to limit the present invention to specific modes of practice, and it is to be appreciated that all changes, equivalents, and substitutes that do not depart from the spirit and technical scope of the present invention are encompassed in the present invention.

It will be understood that, although the terms "first," "second," and the like may be used herein to describe various elements, these elements should not be limited by these terms. The terms are used only for the purpose of distinguishing one element from another element. For example, without departing from the scope of the present invention, a second element could be referred to as a first element, and, similarly, a first element may also be referred to as a second element. The term "and/or" includes a combination of a plurality of related listed items or any one item of the plurality of related listed items.

It should be understood that when an element is referred to as being "connected" or "coupled" to another element, it may be directly connected or coupled to the other element or intervening elements may be present. In contrast, when an element is referred to as being "directly connected," or "directly coupled" to another element, it should be understood that still another element may not be present between the element and another element.

The terminology used herein is for the purpose of describing particular embodiments only and is not intended to be limiting to the invention. It is to be understood that the singular forms include plural forms unless the context clearly dictates otherwise. It should be understood that the terms "comprise," "comprising," "include," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms used herein, including technical and scientific terms, have the same meaning as commonly understood by one of ordinary skill in the art to which the present invention belongs. Terms, such as those defined in commonly used dictionaries, should be interpreted as having a meaning that is consistent with their meaning in the context of the relevant art and will not be interpreted in an idealized or overly formal sense unless clearly defined in the present application.

Hereinafter, embodiments will be described below in detail with reference to the accompanying drawings, but equal or corresponding elements will be referred to as the same reference numerals regardless of drawing signs, and redundant descriptions thereof will be omitted.

FIG. 1 is a cross-sectional view of a thermoelectric element according to one embodiment of the present invention, FIG. 2 is a top view of a metallic substrate included in the thermoelectric element according to one embodiment of the present invention, FIG. 3 is a cross-sectional view of the metallic substrate of the thermoelectric element according to one embodiment of the present invention, FIG. 4 is an enlarged view of one region of FIG. 3, and FIGS. 5 and 6 are enlarged views of another region of FIG. 3.

Referring to FIG. 1, a thermoelectric element 100 includes a first resin layer 110, a plurality of first electrodes 120, a plurality of P-type thermoelectric legs 130, a plurality of N-type thermoelectric legs 140, a plurality of second electrodes 150, and a second resin layer 160.

The plurality of first electrodes 120 are disposed between the first resin layer 110 and lower surfaces of the plurality of P-type thermoelectric legs 130 and the plurality of N-type thermoelectric legs 140, and the plurality of second electrodes 150 are disposed between the second resin layer 160 and upper surfaces of the plurality of P-type thermoelectric legs 130 and the plurality of N-type thermoelectric legs 140. Accordingly, the plurality of P-type thermoelectric legs 130 and the plurality of N-type thermoelectric legs 140 are electrically connected by the plurality of first electrodes 120 and the plurality of second electrodes 150. A pair of the P-type thermoelectric leg 130 and the N-type thermoelectric leg 140, which are disposed between the first electrode 120 and the second electrode 150 and electrically connected to each other, may form a unit cell.

The pair of P-type thermoelectric leg 130 and N-type thermoelectric leg 140 may be disposed on each of the first electrodes 120, and the pair of N-type thermoelectric leg 140 and P-type thermoelectric leg 130 may be disposed on each of the second electrodes 150 such that one of the pair of P-type thermoelectric leg 130 and N-type thermoelectric leg 140 disposed on each of the first electrodes 120 is overlapped.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a thermoelectric leg including a Bi—Te-based main raw material containing at least one among antimony (Sb), nickel (Ni), aluminum (Al), copper (Cu), silver (Ag), lead (Pb), boron (B), gallium (Ga), tellurium (Te), bismuth (Bi), and indium (In) in the range of 99 to 99.999 wt % and a mixture containing Bi or Te in the range of 0.001 to 1 wt % based on a total weight of 100 wt %. For example, a main raw material of the P-type thermoelectric leg 130 may be Bi-selenium (Se)—Te, and the P-type thermoelectric leg 130 may further include Bi or Te in the range of 0.001 to 1 wt % based on a total weight. The N-type thermoelectric leg 140 may be a thermoelectric leg including a Bi—Te-based main raw material containing at least one among Se, Ni, Al, Cu, Ag, Pb, B, Ga, Te, Bi, and In in the range of 99 to 99.999 wt % and a mixture containing Bi or Te in the range of 0.001 to 1 wt % based on a total weight of 100 wt %. For example, a main raw material of the N-type thermoelectric leg 140 may be Bi—Sb—Te, and the N-type thermoelectric leg 140 may further include Bi or Te in the range of 0.001 to 1 wt % based on a total weight.

The P-type thermoelectric leg 130 and the N-type thermoelectric leg 140 may be formed as a bulk type or a stacked type. Generally, the bulk type P-type thermoelectric leg 130 or the bulk type N-type thermoelectric leg 140 may be obtained through a process of performing a thermal process on a thermoelectric material to manufacture an ingot, crushing and sieving the ingot to obtain a powder for a thermoelectric leg, sintering the powder, and cutting a sintered body. The stacked type P-type thermoelectric leg 130 or the stacked type N-type thermoelectric leg 140 may be obtained through a process of coating a sheet-shaped base with a paste including a thermoelectric material to form unit members, stacking the unit members, and cutting the stacked unit members.

Here, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or cross-sectional area of the N-type thermoelectric leg 140 may be formed to be different from that of the P-type thermoelectric leg 130.

The performance of the thermoelectric element according to one embodiment of the present invention may be expressed as a Seebeck index. A Seebeck index ZT may be expressed by Equation 1, $$ZT = \alpha^2 \cdot \sigma \cdot T/k \qquad [\text{Equation 1}]$$

where $\alpha$ is the Seebeck coefficient [V/K], $\sigma$ is electrical conductivity[S/m], and $\alpha 2\sigma$ is a power factor [W/mK2]. In addition, T is temperature and k is thermal conductivity [W/mK]. k may be expressed as $a \cdot cp \cdot \rho$, wherein a is thermal diffusivity [cm2/S], cp is specific heat [J/gK], and $\rho$ is density [g/cm3].

In order to obtain a Seebeck index of a thermoelectric element, a Z value [V/K] is measured using a Z meter, and then, the Seebeck index (ZT) may be calculated using the measured Z value.

Here, the plurality of first electrodes 120 disposed between the first resin layer 110 and the P-type thermoelectric legs 130 and the N-type thermoelectric legs 140, and the plurality of second electrodes 150 disposed between the second resin layer 160 and the P-type thermoelectric legs 130 and the N-type thermoelectric legs 140 may include at least one among Cu, Ag, and Ni.

In addition, the first resin layer 110 and the second resin layer 160 may be formed to have different sizes. For example, a volume, a thickness, or an area of one of the first resin layer 110 and the second resin layer 160 may be formed to be greater than that of the other one thereof. Accordingly, the heat absorption performance or heat dissipation performance of the thermoelectric element may be enhanced.

Here, the P-type thermoelectric leg 130 or the N-type thermoelectric leg 140 may have a cylindrical shape, a polygonal column shape, an elliptical column shape, or the like.

Alternatively, the P-type thermoelectric leg 130 or the N-type thermoelectric leg 140 may have a stacked type structure. For example, the P-type thermoelectric leg or the N-type thermoelectric leg may be formed by a method of stacking a plurality of structures each having a sheet-shaped base coated with a semiconductor material and then cutting the plurality of structures. Thus, it is possible to prevent the loss of a material and improve electrical conduction properties.

Alternatively, the P-type thermoelectric leg 130 or the N-type thermoelectric leg 140 may be manufactured according to a zone melting method or a powder sintering method. According to the zone melting method, a thermoelectric leg is obtained through a method of manufacturing an ingot using a thermoelectric material and then slowly applying heat to the ingot to refine the ingot such that particles are re-arranged in a single direction, and slowly cooling. According to the powder sintering method, a thermoelectric leg is obtained through a process of manufacturing an ingot using a thermoelectric material, crushing and sieving the ingot to obtain a powder for a thermoelectric leg, and then sintering the powder.

According to the embodiment of the present invention, the first resin layer 110 may be disposed on a first metallic substrate 170, and a second metallic substrate 180 may be disposed on the second resin layer 160.

The first metallic substrate 170 and the second metallic substrate 180 may be made of aluminum, an aluminum alloy, copper, a copper alloy, or the like. The first metallic substrate 170 and the second metallic substrate 180 may support the first resin layer 110, the plurality of first electrodes 120, the plurality of P-type thermoelectric legs 130 and the plurality of N-type thermoelectric legs 140, the plurality of second electrodes 150, the second resin layer 160, and the like, and may be a region which is directly bonded to an application to which the thermoelectric element 100 according to the embodiment of the present invention is applied. Accordingly, the first metallic substrate 170 and the second metallic substrate 180 may be used with a first metallic support and a second metallic support, respectively.

An area of the first metallic substrate 170 may be greater than an area of the first resin layer 110, and an area of the second metallic substrate 180 may be greater than an area of the second resin layer 160. That is, the first resin layer 110 may be disposed in a region spaced apart from an edge of the first metallic substrate 170 by a predetermined distance, and the second resin layer 160 may be disposed in a region spaced apart from an edge of the second metallic substrate 180 by a predetermined distance.

Here, a width length of the first metallic substrate 170 may be greater than a width length of the second metallic substrate 180, or a thickness of the first metallic substrate 170 may be greater than a thickness of the second metallic substrate 180. The first metallic substrate 170 may be a heat dissipating part that dissipates heat, and the second metallic substrate 180 may be a heat-absorbing part that absorbs heat.

The first resin layer 110 and the second resin layer 160 may be made of an epoxy resin composition including epoxy resins and inorganic fillers. Here, the inorganic fillers may be included in an amount of 68 to 88 vol % of the epoxy resin composition. When the inorganic fillers are included at less than 68 vol %, a thermal conduction effect may be reduced, and when the inorganic fillers are included at more than 88 vol %, the adhesion between the resin layer and the metallic substrate may be reduced and the resin layer may be easily broken.

The first resin layer 110 and the second resin layer 160 may have a thickness of 0.02 to 0.6 mm, preferably 0.1 to 0.6 mm, and more preferably 0.2 to 0.6 mm and may have a thermal conductivity of 1 W/mK or more, preferably 10 W/mK or more, and more preferably 20 W/mK or more. In a case that the thickness of each of the first resin layer 110 and the second resin layer 160 satisfies the above numerical range, even when the first resin layer 110 and the second resin layer 160 are repeatedly contracted and expanded according to a change in temperature, the bonding between the first resin layer 110 and the first metallic substrate 170 and the bonding between the second resin layer 160 and the second metallic substrate 180 may not be affected.

To this end, the epoxy resin may include an epoxy compound and a curing agent. In this case, the curing agent may be included in a volume ratio of 1 to 10 with respect to a volume ratio of 10 of the epoxy compound. Here, the epoxy compound may include at least one among a crystalline epoxy compound, an amorphous epoxy compound, and a silicone epoxy compound. The crystalline epoxy compound may include a mesogen structure. Mesogen is a basic unit of a liquid crystal and includes a rigid structure. In addition, the amorphous epoxy compound may be a conventional amorphous epoxy compound having two or more epoxy groups in a molecule, and for example, may be glycidyl ethers derived from bisphenol A or bisphenol F. Here, the curing agent may include at least one among an amine-based curing agent, a phenol-based curing agent, an acid anhydride-based curing agent, a polymercaptan-based curing agent, a polyaminoamide-based curing agent, an isocyanate-based curing agent, and a block isocyanate-based curing agent, and alternatively, two or more kinds of curing agents may be mixed to be used as the curing agent.

The inorganic fillers may include aluminum oxides and nitrides, and the nitrides may be included in an amount of 55 to 95 wt % and more preferably 60 to 80 wt % of the inorganic filler. When the nitrides are included in the above numerical range, thermal conductivity and bonding strength may be increased. Here, the nitrides may include at least one of boron nitride and aluminum nitride. Here, the boron nitride may be a boron nitride agglomerate in which plate-shaped boron nitrides are agglomerated, and a surface of the boron nitride agglomerate may be coated with a polymer having Monomer 1 below, or at least some of voids in the boron nitride agglomerate may be filled with the polymer having Monomer 1 below.

The Monomer 1 is as follows,

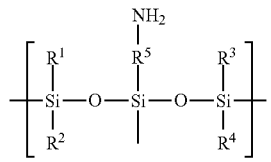

[Monomer 1]

where, one among R1, R2, R3, and R4 may be H, the remainder thereamong may be selected from the group consisting of C1 to C3 alkyl, C2 to C3 alkene, and C2 to C3 alkyne, and R5 may be a linear, branched, or cyclic divalent organic linker having 1 to 12 carbon atoms.

As one example, one of the remainder among R1, R2, R3, and R4 excluding H may be selected from C2 to C3 alkene, and another one and still another one of the remainder thereamong may be selected from C 1 to C3 alkyl. For example, the polymer according to the embodiment of the present invention may include Monomer 2 below.

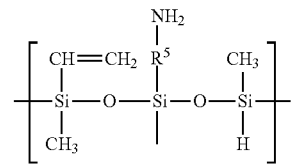

[Monomer 2]

Alternatively, the remainder among R1, R2, R3, and R4 excluding H may be selected to be different from each other in the group consisting of C1 to C3 alkyl, C2 to C3 alkene, and C2 to C3 alkyne.

As described above, when the polymer according to the Monomer 1 or the Monomer 2 is applied on the boron nitride agglomerate in which plate-shaped boron nitrides are agglomerated and fills at least some of the voids in the boron nitride agglomerate, an air layer in the boron nitride agglomerates may be minimized to increase thermal conduction performance of the boron nitride agglomerate, and it is possible to prevent a breakage of the boron nitride agglomerate by increasing the bonding force between the plate-shaped boron nitrides. In addition, when a coating layer is formed on the boron nitride agglomerate in which plate-shaped boron nitrides are agglomerated, it is easy to form a functional group, and, when the functional group is formed on the coating layer of the boron nitride agglomerate, affinity with a resin may be increased.

In this case, a particle size D50 of the boron nitride agglomerate may be in a range of 250 to 350 μm, and a particle size D50 of the aluminum oxide may be in a range of 10 to 30 μm. When the particle size D50 of the boron nitride agglomerate and the particle size D50 of the aluminum oxide satisfy the above numerical ranges, the boron nitride agglomerate and the aluminum oxide may be uniformly dispersed in the epoxy resin composition, and accordingly, the entire resin layer may have a uniform thermal conduction effect and bonding performance.

As described above, when the first resin layer 110 is disposed between the first metallic substrate 170 and the plurality of first electrodes 120, heat transfer between the first metallic substrate 170 and the plurality of first electrodes 120 is possible without having a separate ceramic substrate, and a separate adhesive or physical fastening means is not required due to the bonding performance of the first resin layer 110 itself. Accordingly, the overall size of the thermoelectric element 100 may be reduced.

Here, the first metallic substrate 170 may be in direct contact with the first resin layer 110. To this end, a surface roughness may be formed on a surface, on which the first resin layer 110 is disposed, among both surfaces of the first metallic substrate 170, that is, on the surface of the first metallic substrate 170 facing the first resin layer 110. Accordingly, a problem may be prevented in which the first resin layer 110 is delaminated from the first metallic substrate 170 when the first metallic substrate 170 and the first resin layer 110 are thermally pressed. In the present specification, the term "surface roughness" refers to unevenness and may be used with surface coarseness.

Referring to FIGS. 2 to 4, the surface, on which the first resin layer 110 is disposed, among both surfaces of the first metallic substrate 170, that is, the surface of the first metallic substrate 170 facing the first resin layer 110, includes a first region 172 and a second region 174, and the second region 174 may be disposed in the first region 172. That is, the first region 172 may be disposed within a predetermined distance from the edge of the first metallic substrate 170 toward a central region of the first metallic substrate 170 and may surround the second region 174.

Here, a surface roughness of the second region 174 is greater than a surface roughness of the first region 172, and the first resin layer 110 may be disposed on the second region 174. In this case, the first resin layer 110 may be disposed to be spaced apart from the boundary between the first region 172 and the second region 174 by a predetermined distance. That is, the first resin layer 110 is disposed on the second region 174 such that an edge thereof is located in the second region 174. Accordingly, a portion of the first resin layer 110, that is, an epoxy resin 600 and a portion 604 of the inorganic fillers included in the first resin layer 110, may penetrate into at least a portion of grooves 400 formed due to the surface roughness of the second region 174, and the adhesion between the first resin layer 110 and the first metallic substrate 170 may be increased.

However, the surface roughness of the second region 174 may be greater than a particle size D50 of the portion of the inorganic fillers included in the first resin layer 110 and may be smaller than a particle size D50 of another portion thereof. Here, the particle size D50 refers to a particle size corresponding to 50% of a weight percentage in a particle size distribution curve, that is, the particle size at which passing mass percentage is 50% and may be used with an average particle size. When a case in which the first resin layer 110 includes aluminum oxides and boron nitrides as the inorganic fillers is illustrated as an example, the aluminum oxides may not affect the bonding performance between the first resin layer 110 and the first metallic substrate 170, but the boron nitrides may adversely affect the bonding performance between the first resin layer 110 and the first metallic substrate 170 because boron nitrides have a smooth surface. Thus, when the surface roughness of the second region 174 is greater than the particle size D50 of the aluminum oxide included in the first resin layer 110 but less than the particle size D50 of the boron nitride, in the grooves formed due to the surface roughness of the second region 174, only the aluminum oxides may be disposed and the boron nitrides may not be disposed so that a high bonding strength may be maintained between the first resin layer 110 and the first metallic substrate 170.

Accordingly, the surface roughness of the second region 174 may be 1.05 to 1.5 times a particle size D50 of the inorganic filler 604, which has a relatively small size among the inorganic fillers included in the first resin layer 110, for example, the aluminum oxide, and may be 0.04 to 0.15 times a particle size D50 of an inorganic filler 602, which has a relatively large size among the inorganic fillers included in the first resin layer 110, for example, the boron nitride.

As described above, when the particle size D50 of the boron nitride agglomerate is in the range of 250 to 350 μm and the particle size D50 of the aluminum oxide is in the range of 10 to 30 μm, the surface roughness of the second region 174 may be in a range of 1 to 50 μm. Thus, in the grooves formed due to the surface roughness of the second region 174, only the aluminum oxides may be disposed and the boron nitride agglomerate may not be disposed.

Accordingly, the content of the epoxy resins and the inorganic fillers in the grooves formed due to the surface roughness of the second region 174 may be different from the content of the epoxy resins and the inorganic fillers in an intermediate region between the first metallic substrate 170 and the plurality of first electrodes 120.

The surface roughness may be measured using a surface roughness measuring device. The surface roughness measuring device may be provided to measure cross-section curves using a probe and calculate the surface roughness using a peak line, a valley bottom line, an average line, and a reference length of the cross-section curves. In the present specification, the surface roughness may mean an arithmetic average roughness Ra obtained by a method of calculating the centerline average. The arithmetic average roughness Ra may be obtained through Equation 2 below.

$$R_a = \frac{1}{L}\int_0^L |f(x)|\,dx \qquad \text{[Equation 2]}$$

That is, when the cross-section curve obtained by the probe of the surface roughness measuring device is extracted by as much as the reference length L and expressed as the function (f(x)) with an average line direction set to an x-axis and a height direction set to a y-axis, the value obtained by Equation 2 may be expressed in μm.

Meanwhile, referring to FIGS. 5 and 6, at least one of the plurality of first electrodes 120 includes: a first surface 121 disposed to face the first resin layer 110, that is, the first surface 121 facing the first resin layer 110; and a second surface 122, which is a surface opposite to the first surface 121, that is, the surface disposed to face the pair of P-type thermoelectric leg 130 and N-type thermoelectric leg 140, that is, the second surface 122 facing the pair of P-type thermoelectric leg 130 and N-type thermoelectric leg 140, wherein a width length W1 of the first surface 121 and a width length W2 of the second surface 122 may be different. For example, the width length W2 of the second surface 122 may be 0.8 to 0.95 times the width length W1 of the first surface 121. When the width length W1 of the first surface 121 is greater than the width length W2 of the second surface 122 as described above, the contact area between the first electrode 120 and the first resin layer 110 is increased so that the bonding strength between the first resin layer 110 and the first electrode 120 may be increased.

In particular, referring to FIG. 6, a side surface 123 between the first surface 121 and the second surface 122 may have a curved surface having a predetermined curvature. For example, a rounded shape having a predetermined curvature may also be made between the second surface 122 and the side surface 123. Thus, it is easy to fill spaces between the plurality of first electrodes 120 with insulating resins, and accordingly, the plurality of first electrodes 120 may be stably supported on the first resin layer 110, and even when the plurality of first electrodes 120 are disposed to be close to each other, neighboring electrodes may not be electrically affected.

Here, the first electrode 120 may be formed of a Cu layer or may have a structure in which Cu, Ni, and gold (Au) are sequentially stacked or may have a structure in which Cu, Ni, and tin (Sn) are sequentially stacked.

FIG. 7 is a top view of a metallic substrate included in a thermoelectric element according to another embodiment of the present invention, and FIG. 8 is a cross-sectional view of the metallic substrate of the thermoelectric element including the metallic substrate illustrated in FIG. 7. Repetitive descriptions of contents which are the same as those described above with reference to FIGS. 1 to 6 will be omitted.

Referring to FIGS. 7 and 8, a surface, on which a first resin layer 110 is disposed, among both surfaces of a first metallic substrate 170, that is, the surface of the first metallic substrate 170, which faces the first resin layer 110, includes a first region 172 and a second region 174 that is surrounded by the first region 172 and has a surface roughness greater than that of the first region 172, and may further include a third region 176.

Here, the third region 176 may be disposed in the second region 174. That is, the third region 176 may be disposed to be surrounded by the second region 174. In addition, the surface roughness of the second region 174 may be formed to be greater than a surface roughness of the third region 176.

Here, the first resin layer 110 may be disposed to be spaced apart from the boundary between the first region 172 and the second region 174 by a predetermined distance and to cover the third region 176 and a portion of the second region 174.

In order to increase bonding strength between the first metallic substrate 170 and the first resin layer 110, an adhesive layer 800 may be further disposed between the first metallic substrate 170 and the first resin layer 110.

The adhesive layer 800 may be an epoxy resin composition that is the same as an epoxy resin composition forming the first resin layer 110. For example, the first metallic substrate 170 may be bonded to the first resin layer 110 by a method of applying the epoxy resin composition, in a non-cured state, that is the same as the epoxy resin composition of the first resin layer 110 to a space between the first metallic substrate 170 and the first resin layer 110 and then stacking the first resin layer 110 in a cured state and pressurizing at high temperature.

In this case, a portion of the adhesive layer 800, for example, some of epoxy resins and inorganic fillers of the epoxy resin composition forming the adhesive layer 800, may be disposed in at least some of grooves formed due to the surface roughness of the second region 174.

FIG. 9 is a cross-sectional view of a thermoelectric element according to still another embodiment of the present invention, FIG. 10 is a perspective view of the thermoelectric element according to FIG. 9, and FIG. 11 is an exploded perspective view of the thermoelectric element according to FIG. 9. Repetitive descriptions of contents which are the same as those described above with reference to FIGS. 1 to 8 will be omitted.

Referring to FIGS. 9 to 11, a thermoelectric element 100 according to the embodiment of the present invention includes a sealing part 190.

The sealing part 190 may be disposed at a side surface of a first resin layer 110 and a side surface of a second resin layer 160 on a first metallic substrate 170. That is, the sealing part 190 may be disposed between the first metallic substrate 170 and a second metallic substrate 180 to surround the outermost side of a plurality of first electrodes 120, the outermost side of a plurality of P-type thermoelectric legs 130 and a plurality of N-type thermoelectric legs 140, the outermost side of a plurality of second electrodes 150, and the side surface of the second resin layer 160. Thus, the first resin layer 110, the plurality of first electrodes 120, the plurality of P-type thermoelectric legs 130, the plurality of N-type thermoelectric legs 140, the plurality of second electrodes 150, and the second resin layer may be sealed from external moisture, heat, contamination, and the like.

Here, the sealing part 190 may be disposed on a first region 172. As described above, when the sealing part 190 is disposed on the first region 172 having a small surface roughness, the sealing effect between the sealing part 190 and the first metallic substrate 170 may be increased.

Here, the sealing part 190 may include: a sealing case 192 disposed to be spaced apart by a predetermined distance from the side surface of the first resin layer 110, the outermost side of the plurality of first electrodes 120, the outermost side of the plurality of P-type thermoelectric legs 130 and the plurality of N-type thermoelectric legs 140, the outermost side of the plurality of second electrodes 150, and the side surface of the second resin layer 160; a sealing material 194 disposed between the sealing case 192 and the first region 172 of the first metallic substrate 170; and a sealing material 196 disposed between the sealing case 192 and the side surface of the second metallic substrate 180. As described above, the sealing case 192 may be in contact with the first metallic substrate 170 and the second metallic substrate 180 through the sealing materials 194 and 196. Thus, a problem may be prevented in which thermal conduction occurs through the sealing case 192 when the sealing case 192 is in direct contact with the first metallic substrate 170 and the second metallic substrate 180 and as a result ΔT is lowered. In particular, according to the embodiment of the present invention, a portion of an inner wall of the sealing case 192 is formed to be inclined, and the sealing material 196 is disposed on the side surface of the second metallic substrate 180 between the second metallic substrate 180 and the sealing case 192. Accordingly, the volume between the first metallic substrate 170 and the second metallic substrate 180 may be increased and thus heat exchange may be actively performed, thereby obtaining a higher ΔT.

Here, the sealing materials 194 and 196 may include at least one of an epoxy resin and a silicone resin or may include a tape having both surfaces on which at least one of an epoxy resin and a silicone resin is applied. The sealing materials 194 and 196 may serve to hermetically seal between the sealing case 192 and the first metallic substrate 170 and between the sealing case 192 and the second metallic substrate 180, may improve the effect of sealing the first resin layer 110, the plurality of first electrodes 120, the plurality of P-type thermoelectric legs 130, the plurality of N-type thermoelectric legs 140, the plurality of second electrodes 150, and the second resin layer 160, and may be used with a finishing material, a finishing layer, a waterproof material, a waterproof layer, and the like.

Meanwhile, guide grooves G configured to lead wires 200 and 202 connected to the electrodes may be formed in the sealing case 192. To this end, the sealing case 192 may be an injection molded product made of plastic or the like and may be used with a sealing cover.

Here, the first metallic substrate 170 may be a heat dissipating part or a heating part that dissipates heat, and the second metallic substrate 180 may be a heat-absorbing part or a cooling part that absorbs heat. To this end, a width length of the first metallic substrate 170 may be greater than a width length of the second metallic substrate 180, or a thickness of the first metallic substrate 170 may be less than a thickness of the second metallic substrate 180. Thus, the first metallic substrate 170, which is a heat dissipating part or a heating part, may be implemented to have a small thermal resistance, and the sealing part 190 may be stably disposed. In particular, in order for the sealing part 190 to be stably disposed, the first metallic substrate 170 may be formed to be greater than the second metallic substrate 180 by as much as an area corresponding to the first region 172. The second metallic substrate 180, which is a heat-absorbing part or a cooling part, may be in contact with an object with the minimum area, thereby minimizing heat loss. When the thermoelectric element according to the embodiment of the present invention is applied to an application for cooling, the thickness of the second metallic substrate 180 may be changed depending on the heat capacity of a required cooling system.

The embodiment described with reference to FIGS. 9 to 11 may also be applied to the embodiment described with reference to FIGS. 1 to 6, in which the first metallic substrate 170 includes the first region 172 and the second region 174, as well as the embodiment described with reference to FIGS. 7 and 8, in which the first metallic substrate 170 includes the first region 172, the second region 174, and the third region 176.

Hereinafter, a method of manufacturing the thermoelectric element according to the embodiment of the present invention will be described with reference to the drawings.

FIGS. 12 and 13 illustrate a method of manufacturing the thermoelectric element according to one embodiment of the present invention.

Referring to FIG. 12, a metallic layer is bonded on a resin layer (S1200), and a plurality of electrodes are formed by etching the metallic layer (S1210). In order to etch the metallic layer, a mask having a shape of the plurality of electrodes may be disposed on the metallic layer, and then an etching solution may be sprayed. When the metallic layer is etched as described above, the degree of freedom of changing a design may be increased, and the distance between the electrodes may be formed to be small. Here, the electrode may include at least one of Cu, Ni, Au, and Sn. For example, the electrode may be formed of a Cu layer. Alternatively, the electrode may have a structure in which Cu, Ni, and Au are sequentially stacked or may have a structure in which Cu, Ni, and Sn are sequentially stacked. To this end, in the operation of S1200, the metallic layer bonded on the resin layer may include an Ni layer and an Au layer plated on a Cu layer, or an Ni layer and an Sn layer plated on a Cu layer. Alternatively, in the operation of S1200, the metallic layer bonded on the resin layer may be a Cu layer, and the Cu layer may be etched to form a plurality of electrodes, and then an Ni layer and an Au layer may be sequentially plated on the plurality of electrodes, or an Ni layer and an Sn layer may be sequentially plated on the plurality of electrodes.

Meanwhile, a surface roughness is formed on one surface among both surfaces of a metallic substrate (S1220). Surface roughening may be performed by various methods such as sandblasting, sawing, casting, forging, turning, milling, boring, drilling, electrical discharge machining, and the like, but the present invention is not limited thereto. As described above, the surface roughening may be performed only in a partial region of one surface among both surfaces of the metallic substrate. For example, as in the embodiment described with reference to FIGS. 1 to 6, the surface roughening may be performed in a partial region of the metallic substrate including that edge, that is, the second region, that is, the remaining region of the metallic substrate excluding the first region and including the central region. Alternatively, as in the embodiment described with reference to FIGS. 7 and 8, the surface roughening may be performed in a partial region of the metallic substrate including the edge, that is, a second region, that is, the remaining region of the metallic substrate excluding the third region and including the first region and a central region.

Next, the metallic substrate on which the surface roughness is formed and the resin layer are bonded (S1230). To this end, one surface of the metallic substrate, on which the surface roughness is formed, and a surface opposite to a surface, on which the plurality of electrodes are formed, among both surfaces of the resin layer are arranged to be in contact with each other, and then the metallic substrate and the resin layer may be thermally pressed. To this end, before the second region of the metallic substrate and the resin layer are arranged to be in contact with each other, an operation of disposing an adhesive layer, in a non-cured state, between the metallic substrate and the resin layer may be further included.

In more detail, referring to FIGS. 13A, 13B, and 13C, a process of coating a resin layer on a Cu layer, a process of coating an adhesive layer on a release film, and a process of forming a surface roughness on a metallic substrate are each performed. Here, an epoxy resin composition forming the resin layer and an epoxy resin composition forming the adhesive layer may be the same epoxy resin composition.

Referring to FIG. 13D, when a Cu layer for forming an electrode is further disposed on the resin layer that is coated in the operation illustrated with reference to FIG. 13A and then thermally pressed, the resin layer is cured to obtain a structure as illustrated in FIG. 13E.

Next, as illustrated in FIG. 13F, the Cu layer is etched to form a plurality of electrodes, and then a plated layer may be formed on the plurality of electrodes as illustrated in FIG. 13G.

Thereafter, the adhesive layer, which is coated on the release film in the operation illustrated with reference to FIG. 13B, is disposed on a surface opposite to a surface, on which the plurality of electrodes are formed, among both surfaces of the resin layer and pressed, and then the release film may be removed. In this case, the adhesive layer may be in a semi-cured state.

In addition, the surface from which the release film is removed is disposed on the metallic substrate, on which the surface roughness is formed, and pressed to bond the metallic substrate and the resin layer.

Accordingly, a portion of the adhesive layer in a semi-cured state may penetrate into grooves due to the surface roughness formed on the metallic substrate.

Hereinafter, an example in which the thermoelectric element according to the embodiment of the present invention is applied to a water purifier will be described with reference to FIG. 14.

FIG. 14 is a block diagram of a water purifier to which the thermoelectric element according to the embodiment of the present invention is applied.

A water purifier 1 to which the thermoelectric element according to the embodiment of the present invention is applied includes a raw water supply pipe 12a, a purified water tank inlet pipe 12b, a purified water tank 12, a filter assembly 13, a cooling fan 14, a heat storage tank 15, a cold water supply pipe 15a, and a thermoelectric device 1000.

The raw water supply pipe 12a is a supply pipe which introduces water to be purified into the filter assembly 13 from a water source, the purified water tank inlet pipe 12b is an inlet pipe which introduces the purified water from the filter assembly 13 into the purified water tank 12, and the cold water supply pipe 15a is a supply pipe from which cold water cooled in the purified water tank 12 by the thermoelectric device 1000 to a predetermined temperature is finally supplied to a user.

The purified water tank 12 temporarily accommodates purified water to store and supply the water, which is purified by passing through the filter assembly 13 and is introduced through the purified water tank inlet pipe 12b, to the outside.

The filter assembly 13 includes a precipitation filter 13a, a pre-carbon filter 13b, a membrane filter 13c, and a post-carbon filter 13d.

That is, the water introduced into the raw water supply pipe 12a may be purified while passing through the filter assembly 13.

The heat storage tank 15 is disposed between the purified water tank 12 and the thermoelectric device 1000 and stores cold air formed in the thermoelectric device 1000. The cold air stored in the heat storage tank 15 is supplied to the purified water tank 12 to cool the water stored in the purified water tank 120.

The heat storage tank 15 may be in surface contact with the purified water tank 12 so that the cold air can be smoothly transferred.

As described above, the thermoelectric device 1000 is provided with a heat absorption surface and a heating surface, and one side of the thermoelectric device 1000 is cooled and the other side thereof is heated due to electron movements in a P-type semiconductor and an N-type semiconductor.

Here, the one side may be a side of the purified water tank 12, and the other side may be a side opposite to the purified water tank 12.

In addition, as described above, the thermoelectric device 1000 has excellent waterproof and dust-proof performance and improved heat flow performance so that the thermoelectric device 1000 may efficiently cool the purified water tank 12 in the water purifier.

Hereinafter, an example in which the thermoelectric element according to the embodiment of the present invention is applied to a refrigerator will be described with reference to FIG. 15.

FIG. 15 is a block diagram of a refrigerator to which the thermoelectric element according to one embodiment of the present invention is applied.

The refrigerator includes a deep temperature evaporation chamber cover 23, an evaporation chamber partition wall 24, a main evaporator 25, a cooling fan 26, and a thermoelectric device 1000 in a deep temperature evaporation chamber.

An interior of the refrigerator is divided into a deep temperature storage chamber and the deep temperature evaporation chamber by the deep temperature evaporation chamber cover 23.

In more detail, an inner space corresponding to a front side of the deep temperature evaporation chamber cover 23 may be defined as the deep temperature storage chamber, and an inner space corresponding to a rear side of the deep temperature evaporation chamber cover 23 may be defined as the deep temperature evaporation chamber.

A discharge grille 23a and a suction grille 23b may be formed on a front surface of the deep temperature evaporation chamber cover 23.

The evaporation chamber partition wall 24 is installed at a position spaced apart from a back wall of an inner cabinet to the front side, thereby partitioning a space in which a deep temperature chamber storage system is provided from a space in which the main evaporator 25 is provided.

Cold air cooled by the main evaporator 25 is supplied to a freezer compartment and then returned to the main evaporator.

The thermoelectric device 1000 is accommodated in the deep temperature evaporation chamber and has a structure in which the heat absorption surface faces a drawer assembly of the deep temperature storage chamber and the heating surface faces an evaporator. Accordingly, a heat absorption phenomenon which occurs in the thermoelectric device 1000 may be used to quickly cool food stored in the drawer assembly to an ultra-low temperature state that is less than or equal to 50 degrees Celsius.

Further, as described above, the thermoelectric device 1000 has excellent waterproof and dust-proof performance and improved heat flow performance so that the thermoelectric device 1000 may efficiently cool the drawer assembly in the refrigerator.

The thermoelectric element according to the embodiment of the present invention may be applied to power generation devices, cooling devices, heating devices, and the like. In more detail, the thermoelectric element according to the embodiment of the present invention may be mainly applied to optical communication modules, sensors, medical devices, measurement devices, the aerospace industry, refrigerators, chillers, vehicle ventilation seats, cup holders, washing machines, dryers, wine cellars, water purifiers, power supplies for sensors, thermopiles, and the like.

Here, an example in which the thermoelectric element according to the embodiment of the present invention is applied to a medical device includes a polymerase chain reaction (PCR) device. The PCR device is a device for amplifying deoxyribonucleic acid (DNA) to determine a DNA base sequence and requires accurate temperature control and a thermal cycle. To this end, a Peltier-based thermoelectric element may be applied.

Another example in which the thermoelectric element according to the embodiment of the present invention is applied to a medical device includes a photo detector. Here, the photo detector includes an infrared/ultraviolet detector, a charge-coupled device (CCD) sensor, an X-ray detector, a thermoelectric thermal reference source (TTRS), and the like. The Peltier-based thermoelectric element may be applied to cool the photo detector. Accordingly, it is possible to prevent a variation in wavelength, a decrease in output, and a decrease in resolution due to an increase in temperature in the photo detector.

Still other examples in which the thermoelectric element according to the embodiment of the present invention is applied to a medical device include an immunoassay field, an in vitro diagnostics field, general temperature control and cooling systems, a physical therapy field, a liquid chiller system, a blood/plasma temperature control field, and the like. Accordingly, accurate temperature control is possible.

Yet another example in which the thermoelectric element according to the embodiment of the present invention is applied to a medical device includes an artificial heart. Accordingly, power may be supplied to the artificial heart.

Examples of the thermoelectric element according to the embodiment of the present invention applied to an aerospace industry include a star tracking system, a thermal imaging camera, an infrared/ultraviolet detector, a CCD sensor, the Hubble space telescope, a TTRS, and the like. Accordingly, it is possible to maintain a temperature of an image sensor.

Other examples in which the thermoelectric element according to the embodiment of the present invention is applied to an aerospace industry include a cooling device, a heater, a power generation device, and the like.

In addition to the above description, the thermoelectric element according to the embodiment of the present invention may be applied for power generation, cooling, and heating in other industrial fields.

Although the exemplary embodiments of the present invention have been described above, it may be understood by those skilled in the art that a variety of modifications and changes may be made without departing from the concept and scope of the present invention disclosed within the range of the following claims.

The invention claimed is:

1. A thermoelectric element comprising:
   a first metallic substrate;
   a first resin layer which is disposed on the first metallic substrate and is in direct contact with the first metallic substrate;
   a first electrode disposed on the first resin layer;
   a thermoelectric leg disposed on the first electrode;
   a second electrode disposed on the thermoelectric leg;
   a second resin layer disposed on the second electrode; and
   a second metallic substrate disposed on the second resin layer,
   wherein a top surface of the first metallic substrate, which faces a bottom surface of the first resin layer, includes a first region and a second region, wherein a total surface area of the top surface of the first metallic substrate is greater than a total surface area of the bottom surface of the first resin layer,
   wherein the top surface includes a first edge, a second edge, a third edge and a fourth edge, wherein the first edge extends in a first direction from the fourth edge to the second edge, the second edge extends in a second direction, which is transverse to the first direction, from the first edge to the third edge, the third edge extends in the first direction from the fourth edge to the second edge, and the fourth edge extends in the second direction from the first edge to the fourth edge,
   wherein the first region of the top surface is a first complete area from the first edge to the second region, from the second edge to the second region, from the third edge to the second region, and from the fourth edge to the second region such that the second region is surrounded on the top surface by the first complete area,
   a surface roughness of the entire second region is greater than a surface roughness of the entire first region,
   at least a part of the first region does not overlap with the first resin layer in a vertical direction, a width of the first metallic substrate is greater than a width of the second metallic substrate, wherein the top surface of the first metallic substrate includes a third region surrounded by the second region, the first resin layer is disposed on the third region and a portion of the second region, and the surface roughness of the entire second region is greater than a surface roughness of the entire third region.

2. The thermoelectric element of claim 1, wherein
   the first resin layer includes a resin and an inorganic filler,
   the inorganic filler includes a first inorganic filler and a second inorganic filler, and
   a particle size (D50) of the first inorganic filler is greater than a particle size (D50) of the second inorganic filler.

3. The thermoelectric element of claim 2, wherein the surface roughness of the entire second region is greater than the particle size (D50) of the first inorganic filler, and the surface roughness of the entire second region is less than the particle size (D50) of the second inorganic filler.

4. The thermoelectric element of claim 3, wherein the surface roughness of the entire second region is 1.05 to 1.5 times the particle size (D50) of the first inorganic filler.

5. The thermoelectric element of claim 3, wherein the surface roughness of the entire second region is 0.04 to 0.15 times the particle size (D50) of the second inorganic filler.

6. The thermoelectric element of claim 2, wherein
   the surface roughness of the entire second region is in a range of 10 μm to 50 μm,
   the particle size (D50) of the first inorganic filler is in a range of 10 μm to 30 μm, and
   the particle size (D50) of the second inorganic filler is in a range of 250 μm to 350 μm.

7. The thermoelectric element of claim 1, further comprising a sealing part disposed between the first region of the first metallic substrate and the second metallic substrate,
   wherein the sealing part is to directly contact the top surface only at the first region.

8. The thermoelectric element of claim 1, wherein
   the first resin layer includes an epoxy resin composition including an epoxy resin and an inorganic filler,
   the inorganic filler includes at least one of an aluminum oxide and a nitride, and
   the inorganic filler is included in an amount of 68 vol % to 88 vol % of the epoxy resin composition.

9. The thermoelectric element of claim 8, wherein the inorganic filler includes an aluminum oxide having a particle size (D50) of 10 μm to 30 μm and a boron nitride agglomerate having a particle size (D50) of 250 μm to 350 μm.

10. The thermoelectric element of claim 1, wherein
    the first electrode includes a first surface facing the first resin layer, and a second surface facing the thermoelectric leg, and
    a width of the first surface is different from a width of the second surface.

11. The thermoelectric element of claim 10, wherein the width of the second surface is 0.8 to 0.95 times the width of the first surface.

12. The thermoelectric element of claim 10, wherein a side surface between the first surface and the second surface includes a curved surface having a predetermined curvature.

13. The thermoelectric element of claim 1, wherein the first metallic substrate emits heat and the second metallic substrate absorbs heat.

14. The thermoelectric element of claim 1, wherein a thickness of the first metallic substrate is less than a thickness of the second metallic substrate.

* * * * *